United States Patent
Nishimura et al.

(10) Patent No.: US 8,023,233 B2
(45) Date of Patent: *Sep. 20, 2011

(54) TUNNELING MAGNETIC SENSING ELEMENT INCLUDING FREE MAGNETIC LAYER AND IRMN PROTECTIVE LAYER DISPOSED THEREON AND METHOD FOR MANUFACTURING THE SAME

(75) Inventors: Kazumasa Nishimura, Niigata-ken (JP); Ryo Nakabayashi, Niigata-ken (JP); Naoya Hasegawa, Niigata-ken (JP); Masamichi Saito, Niigata-ken (JP); Yosuke Ide, Niigata-ken (JP); Masahiko Ishizone, Niigata-ken (JP)

(73) Assignee: TDK Corporation, Tokyo (JP)

( * ) Notice: Subject to any disclaimer, the term of this patent is extended or adjusted under 35 U.S.C. 154(b) by 913 days.

This patent is subject to a terminal disclaimer.

(21) Appl. No.: 11/945,468

(22) Filed: Nov. 27, 2007

(65) Prior Publication Data

US 2008/0160325 A1 Jul. 3, 2008

(30) Foreign Application Priority Data

Dec. 28, 2006 (JP) ................................. 2006-355063

(51) Int. Cl.
*G11B 5/39* (2006.01)

(52) U.S. Cl. ..................................................... 360/324.2

(58) Field of Classification Search ............... 360/324.1, 360/324.11, 324.12, 324.2

See application file for complete search history.

(56) References Cited

U.S. PATENT DOCUMENTS

| | | | | |
|---|---|---|---|---|
| 2004/0252419 A1* | 12/2004 | Takano | ................... | 360/324.12 |
| 2008/0080102 A1* | 4/2008 | Ibusuki et al. | ............. | 360/324.2 |
| 2008/0253038 A1* | 10/2008 | Nakabayashi et al. | ..... | 360/324.2 |

FOREIGN PATENT DOCUMENTS

| | | |
|---|---|---|
| JP | 2000-106462 | 4/2000 |
| JP | 2001-223412 | 8/2001 |
| JP | 2006-196745 | 7/2006 |

* cited by examiner

*Primary Examiner* — Jefferson Evans
(74) *Attorney, Agent, or Firm* — Brinks Hofer Gilson & Lione (57) ABSTRACT

A tunneling magnetic sensing element includes a pinned magnetic layer whose magnetization direction is pinned in one direction, an insulating barrier layer disposed on the pinned magnetic layer, a free magnetic layer whose magnetization direction varies in response to an external magnetic field disposed on the insulating barrier layer, and a first protective layer composed of iridium-manganese (IrMn) disposed on the free magnetic layer. Consequently, a high rate of change in resistance is obtained and the magnetostriction of the free magnetic layer is low, compared with a tunneling magnetic sensing element which is not provided with a first protective layer.

6 Claims, 5 Drawing Sheets

TUNNELING MAGNETIC SENSING ELEMENT INCLUDING FREE MAGNETIC LAYER AND IRMN PROTECTIVE LAYER DISPOSED THEREON AND METHOD FOR MANUFACTURING THE SAME

CLAIM OF PRIORITY

This application claims benefit of the Japanese Patent Application No. 2006-355063 filed on Dec. 28, 2006, the entire content of which is hereby incorporated by reference.

BACKGROUND OF THE INVENTION

1. Field of the Invention

The present invention relates to magnetic sensing elements which utilize a tunneling effect and which are to be mounted on magnetic reproducing devices, such as hard disk drives, or other magnetic sensing devices. More particularly, the invention relates to a tunneling magnetic sensing element which has a high rate of change in resistance ($\Delta R/R$) without greatly increasing the magnetostriction $\lambda$ of its free magnetic layer, the element thus having excellent magnetic sensitivity and stability, and a method for manufacturing the same.

2. Description of the Related Art

In a tunneling magnetic sensing element (tunneling magnetoresistance element), the change in resistance is caused by a tunneling effect. When the magnetization direction of a pinned magnetic layer is antiparallel to the magnetization direction of a free magnetic layer, a tunnel current does not easily flow through an insulating barrier layer (tunnel barrier layer) provided between the pinned magnetic layer and the free magnetic layer, and the resistance is at a maximum. On the other hand, when the magnetization direction of the pinned magnetic layer is parallel to the magnetization direction of the free magnetic layer, the tunnel current flows easily, and the resistance is at a minimum.

By use of the principle described above, a change in electrical resistance caused by a variation in the magnetization of the free magnetic layer under an influence of an external magnetic field is captured as a change in voltage, and thus a leakage magnetic field from a recording medium is detected.

Japanese Unexamined Patent Application Publication No. 2001-223412 (Patent Document 1) and Japanese Unexamined Patent Application Publication No. 2006-196745 (Patent Document 2) each describe a magnetoresistance element in which a film that prevents interdiffusion is disposed between a magnetic layer and a protective film.

Japanese Unexamined Patent Application Publication No. 2000-106462 (Patent Document 3) describes a tunneling magnetic sensing element.

In tunneling magnetic sensing elements, one of the problems to be solved is increasing detection sensitivity by achieving a high rate of change in resistance ($\Delta R/R$) to improve the characteristics of read heads. In order to increase the rate of change in resistance ($\Delta R/R$) of a tunneling magnetic sensing element, it is known to be effective to change the composition of the free magnetic layer, for example, by using a material having high spin polarizability at the interface with the insulating barrier layer.

When the iron (Fe) content at the interface with the insulating barrier layer is increased, spin polarizability can be increased and the rate of change in resistance ($\Delta R/R$) can be increased. However, if the Fe content is high, the magnetostriction $\lambda$ of the free magnetic layer has a large positive value, which causes noise in read heads, resulting in a decrease in stability of read heads.

Besides the method described above, the rate of change in resistance ($\Delta R/R$) can be increased by changing the compositions of the free magnetic layer and the pinned magnetic layer. However, if the compositions of the free magnetic layer and the pinned magnetic layer are changed, other magnetic properties are changed. Therefore, it is desirable to obtain a high rate of change in resistance ($\Delta R/R$) without changing the compositions or thickness of the free magnetic layer and the pinned magnetic layer.

In tunneling magnetic sensing elements, it is important to optimize the structures of the insulating barrier layer and the free magnetic layer in order to increase the rate of change in resistance ($\Delta R/R$). For example, when an insulating barrier layer is composed of magnesium oxide (Mg—O), it is known that, in order to increase the rate of change in resistance ($\Delta R/R$) of the tunneling magnetic sensing element, it is preferable that the free magnetic layer in contact with the insulating barrier layer has a body-centered cubic (bcc) structure.

In such a case, when the protective layer for preventing oxidation disposed on the free magnetic layer is composed of tantalum (Ta), for example, in the heat treatment step in the fabrication process, Ta of the protective layer diffuses into the free magnetic layer and further into the insulating barrier layer, and the free magnetic layer and the insulating barrier layer are inhibited from being crystallized. As a result, strain occurs in the bcc structure of the free magnetic layer or the insulating barrier layer, and it is not possible to obtain a high rate of change in resistance ($\Delta R/R$).

In the giant magnetoresistance element described in Patent Document 1, in order to prevent interdiffusion between a protective layer and a magnetic layer, an interdiffusion-preventing film composed of a high-melting transition metal, such as Ta or Ti, is provided. Thereby, interdiffusion is prevented between the protective layer composed of ruthenium (Ru), platinum (Pt), or the like and the magnetic layer.

Patent Document 2 describes that by disposing an intermediate layer composed of platinum-manganese (PtMn) between a protective layer composed of Ta and a free magnetic layer, interdiffusion between the free magnetic layer and the protective layer can be prevented.

However, neither Patent Document 1 nor Patent Document 2 describes a tunneling magnetic sensing element. That is, neither of them discloses an optimum structure of a protective layer on a free magnetic layer in a tunneling magnetic sensing element.

Furthermore, Patent Document 3 describes the invention relating to a tunneling magnetic sensing element and discloses use of Ta, Ti, or the like for a protective layer. However, Patent Document 3 does not describe at all that by optimizing the protective layer on the free magnetic layer, the rate of change in resistance ($\Delta R/R$) is increased. In Patent Document 3, Ta is used as the protective layer in many examples. However, in such a case, as described above, because of diffusion of Ta into the free magnetic layer and the insulating barrier layer, the rate of change in resistance ($\Delta R/R$) is decreased, which is a problem.

SUMMARY

In an aspect of the present invention, a tunneling magnetic sensing element includes a pinned magnetic layer whose magnetization direction is pinned in one direction, an insulating barrier layer disposed on the pinned magnetic layer, a free magnetic layer whose magnetization direction varies in response to an external magnetic field disposed on the insulating barrier layer, and a first protective layer composed of iridium-manganese (IrMn) disposed on the free magnetic layer.

By forming the first protective layer, which is disposed in contact with the free magnetic layer, using IrMn, it is believed that the element of a layer disposed on the first protective layer does not easily diffuse into the free magnetic layer and the insulating barrier layer and that the crystallinity of the free magnetic layer is improved. Therefore, it is possible to increase the rate of change in resistance ($\Delta R/R$) without changing the composition and thickness of the free magnetic layer and without increasing the magnetostriction $\lambda$ of the free magnetic layer.

The tunneling magnetic sensing element may further include a second protective layer composed of tantalum (Ta) disposed on the first protective layer. In this case, the first protective layer composed of IrMn disposed on the free magnetic layer can appropriately prevent the second protective layer composed of Ta from diffusing into the free magnetic layer and the insulating barrier layer. It is possible to effectively increase the rate of change in resistance ($\Delta R/R$) compared with the case where the protective layer is composed of Ta only as in the known art.

In another aspect of the present invention, a method for manufacturing a tunneling magnetic sensing element includes the steps of (a) forming a pinned magnetic layer and forming an insulating barrier layer on the pinned magnetic layer, (b) forming a free magnetic layer on the insulating barrier layer, and (c) forming a first protective layer composed of iridium-manganese (IrMn) on the free magnetic layer.

Consequently, it is believed that it is possible to prevent the element of a layer formed on the first protective layer from easily diffusing into the free magnetic layer and to improve the crystallinity of the free magnetic layer. Therefore, it is possible to manufacture a tunneling magnetic sensing element which has a high rate of change in resistance ($\Delta R/R$) without changing the composition and thickness of the free magnetic layer and without increasing the magnetostriction $\lambda$ of the free magnetic layer.

In another aspect, the step (c), after the first protective layer is formed, a second protective layer composed of tantalum (Ta) may be formed on the first protective layer.

In the tunneling magnetic sensing element of the present invention, it is believed that it is possible to prevent the element of a layer formed on the first protective layer composed of IrMn from easily diffusing into the free magnetic layer and the insulating barrier layer, and to improve the crystallinity of the free magnetic layer. Therefore, it is possible to increase the rate of change in resistance ($\Delta R/R$) without changing the composition and thickness of the free magnetic layer and without increasing the magnetostriction $\lambda$ of the free magnetic layer.

DESCRIPTION OF THE EMBODIMENTS

Figure 1:
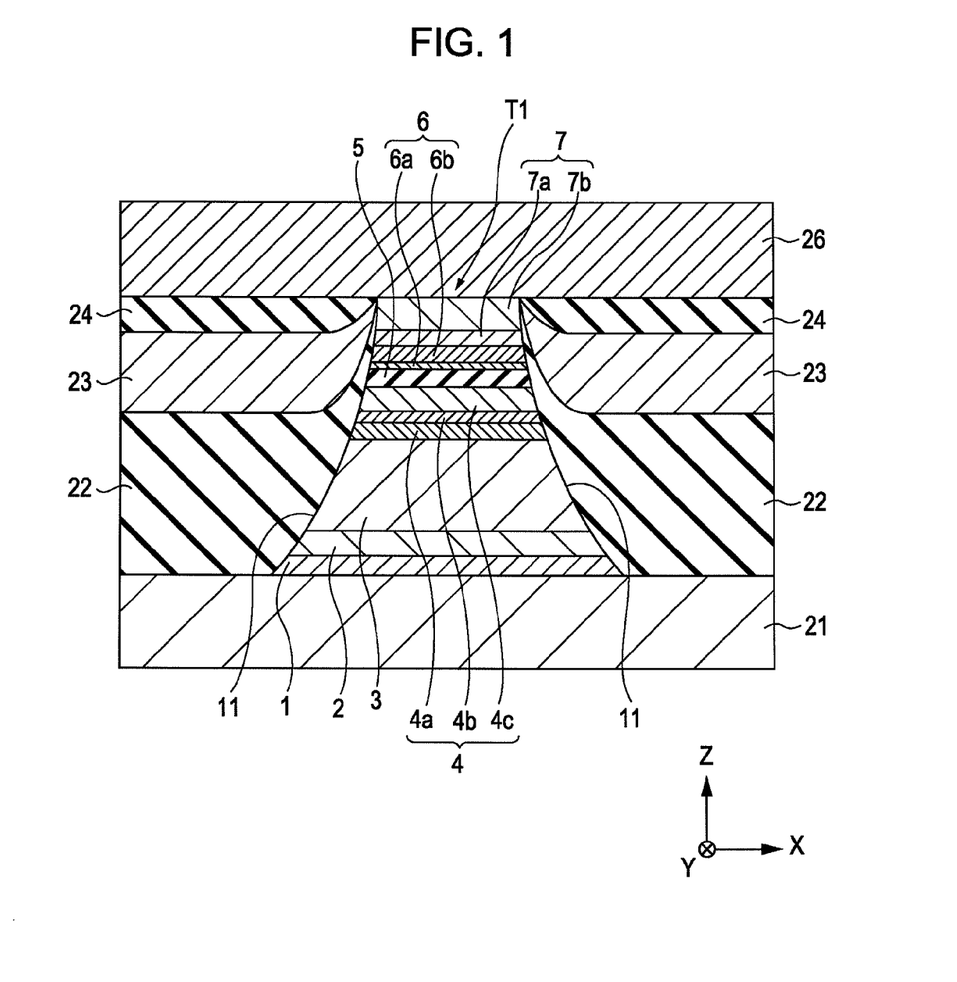
FIG. 1 is a cross-sectional view of a tunneling magnetic sensing element according to an embodiment of the present disclosure, taken in a direction parallel to a surface facing a recording medium.

FIG. 1 is a cross-sectional view of a tunneling magnetic sensing element (tunneling magnetoresistance element) according to an embodiment of the present disclosure, taken in a direction parallel to a surface facing a recording medium.

A tunneling magnetic sensing element is mounted on the trailing end of a floating-type slider provided on a hard disk drive to detect a recorded magnetic field from a hard disk or the like. In the drawings, the X direction corresponds to the track width direction, the Y direction corresponds to the direction of a leakage magnetic field from a magnetic recording medium (height direction), and the Z direction corresponds to the travelling direction of the magnetic recording medium, such as a hard disk, and the lamination direction of the individual layers in the tunneling magnetic sensing element.

Referring to FIG. 1, a lower shield layer 21, for example, composed of a Ni—Fe alloy, is disposed at the bottom. A laminate T1 is disposed on the lower shield layer 21. The tunneling magnetic sensing element includes the laminate T1, and lower insulating layers 22, hard bias layers 23, and upper insulating layers 24 disposed at both sides in the track width direction (in the X direction) of the laminate T1.

The bottom layer in the laminate T1 is an underlying layer 1 composed a nonmagnetic material, such as one or two or more elements selected from the group consisting of Ta, Hf, Nb, Zr, Ti, Mo, and W. A seed layer 2 is disposed on the underlying layer 1. The seed layer 2 is composed of NiFeCr or Cr. When the seed layer 2 is composed of NiFeCr, the seed layer 2 has a face-centered cubic (fcc) structure, and equivalent crystal planes represented as {111} planes are preferentially oriented in the direction parallel to the layer surface. When the seed layer 2 is composed of Cr, the seed layer 2 has a body-centered cubic (bcc) structure, and equivalent crystal planes represented as {110} planes are preferentially oriented in the direction parallel to the layer surface. Note that the underlying layer 1 may be omitted.

An antiferromagnetic layer 3 disposed on the seed layer 2 is preferably composed of an antiferromagnetic material containing X and Mn, wherein X is one or two or more elements selected from the group consisting of Pt, Pd, Ir, Rh, Ru, and Os.

The X—Mn alloys including such platinum-group elements X have excellent properties as antiferromagnetic materials. For example, they have excellent corrosion resistance and high blocking temperature and can generate large exchange coupling magnetic fields (Hex).

The antiferromagnetic layer 3 may be composed of an antiferromagnetic material containing X, X', and Mn, wherein X' is one or two or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

A pinned magnetic layer 4 is disposed on the antiferromagnetic layer 3. The pinned magnetic layer 4 has a laminated ferrimagnetic structure in which a first pinned magnetic sublayer 4a, a nonmagnetic intermediate sublayer 4b, and a second pinned magnetic sublayer 4c are disposed in that order from the bottom. The magnetizations of the first pinned magnetic sublayer 4a and the second pinned magnetic sublayer 4c are directed antiparallel to each other by an exchange coupling magnetic field at the interface with the antiferromagnetic layer 3 and by an antiferromagnetic exchange coupling magnetic field (RKKY interaction) through the nonmagnetic intermediate sublayer 4b. By forming the pinned magnetic layer 4 so as to have such a laminated ferrimagnetic structure, the magnetization of the pinned magnetic layer 4 can be stabilized. Furthermore, the apparent exchange coupling magnetic field generated at the interface between the pinned magnetic layer 4 and the antiferromagnetic layer 3 can be increased. For example, each of the first pinned magnetic sublayer 4a and the second pinned magnetic sublayer 4c has a thickness of about 10 to about 24 Å, and the nonmagnetic intermediate sublayer 4b has a thickness of about 8 to about 10 Å.

The first pinned magnetic sublayer 4a is composed of a ferromagnetic material, such as CoFe, NiFe, or CoFeNi. The nonmagnetic intermediate sublayer 4b is composed of a nonmagnetic conductive material, such as Ru, Rh, Ir, Cr, Re, or Cu. The second pinned magnetic sublayer 4c is composed of the same ferromagnetic material as that of the first pinned magnetic sublayer 4a or CoFeB.

An insulating barrier layer 5 is disposed on the pinned magnetic layer 4. The insulating barrier layer 5 is preferably composed of magnesium oxide (Mg—O), magnesium titanate (Mg—Ti—O), titanium oxide (Ti—O), or aluminum oxide (Al—O). In the case of Mg—O, the Mg content is preferably in a range of about 40 to about 60 atomic percent, and $Mg_{50\ at\ \%}O_{50\ at\ \%}$ is most preferable. Alternatively, the insulating barrier layer 5 may be composed of a laminate of magnesium (Mg) and Mg—O. The insulating barrier layer 5 is formed by sputtering using a target composed of Mg, Mg—O, Mg—Ti—O, Ti—O, or Al—O. In the case of Mg—O, Ti—O, or Al—O, preferably, Mg, Ti, or Al, which is a metal, is formed into a layer with a thickness of 1 to 10 Å, and then oxidation is performed to form Mg—O, Ti—O, or Al—O, which is a metal oxide. In this case, because of the oxidation, the thickness of the metal oxide layer is larger than that of the metal layer of Mg, Ti, or Al formed by sputtering. Preferably, the resulting insulating barrier layer 5 has a thickness of about 1 to about 20 Å. If the thickness of the insulating barrier layer 5 is excessively large, a tunnel current does not easily flow, which is undesirable.

A free magnetic layer 6 is disposed on the insulating barrier layer 5. The free magnetic layer 6 includes a soft magnetic layer 6b composed of a magnetic material, for example, a NiFe alloy, and an enhancement layer 6a composed of, for example, a CoFe alloy, the enhancement layer 6a being disposed between the soft magnetic layer 6b and the insulating barrier layer 5. The soft magnetic layer 6b is preferably composed of a magnetic material having excellent soft magnetic properties. The enhancement layer 6a is preferably composed of a magnetic material that has higher spin polarizability than that of the soft magnetic layer 6b. When the soft magnetic layer 6b is composed of a NiFe alloy, in view of magnetic properties, the Ni content is preferably about 81.5 to about 100 atomic percent.

By forming the enhancement layer 6a using a CoFe alloy having high spin polarizability, it is possible to increase the rate of change in resistance (ΔR/R). In particular, a CoFe alloy having a high Fe content has high spin polarizability, and thus is highly effective in increasing the rate of change in resistance (ΔR/R) of the element. The Fe content in the CoFe alloy is not particularly limited, but may be in a range of about 10 to about 100 atomic percent.

An excessively large thickness of the enhancement layer 6a affects the magnetic sensitivity of the soft magnetic layer 6b, resulting in a decrease in detection sensitivity. Consequently, the enhancement layer 6a has a thickness smaller than that of the soft magnetic layer 6b. The soft magnetic layer 6b has a thickness of, for example, about 30 to about 70 Å, and the enhancement layer 6a has a thickness of about 10 Å. Preferably, the thickness of the enhancement layer 6a is about 6 to 2 about 0 Å.

The free magnetic layer 6 may have a laminated ferrimagnetic structure in which a plurality of magnetic layers are laminated together, each two adjacent magnetic layers being separated by a nonmagnetic intermediate layer. The width in the track width direction (in the X direction) of the free magnetic layer 6 defines the track width Tw. A protective layer 7 is disposed on the free magnetic layer 6.

As described above, the laminate T1 is disposed on the lower shield layer 21. Each side face 11 in the track width direction (in the X direction) of the laminate T1 is formed as an inclined plane such that the width in the track width direction gradually decreases upward.

As shown in FIG. 1, a lower insulating layer 22 is disposed on the lower shield layer 21 extending at each side of the laminate T1 so as to be in contact with each side face 11. A hard bias layer 23 is disposed on the lower insulating layer 22, and an upper insulating layer 24 is disposed on the hard bias layer 23.

A bias underlying layer (not shown) may be disposed between the lower insulating layer 22 and the hard bias layer 23. The bias underlying layer is composed of, for example, Cr, W, or Ti.

Each of the insulating layers 22 and 24 is composed of an insulating material, such as $Al_2O_3$ or $SiO_2$. The insulating layers 24 and 22 insulate the upper and lower surfaces of the hard bias layer 23 so that a current flowing in the laminate T1 perpendicular to the interfaces between the individual layers is prevented from shunting from each side of the laminate T1. The hard bias layer 23 is composed of, for example, a cobalt-platinum (Co—Pt) alloy, a cobalt-chromium-platinum (Co—Cr—Pt) alloy, or the like.

An upper shield layer 26 composed of a Ni—Fe alloy or the like is disposed over the laminate T1 and the upper insulating layers 24.

In the embodiment shown in FIG. 1, the lower shield layer 21 and the upper shield layer 26 serve as electrode layers for the laminate T1. A current is made to flow perpendicular to the planes of the individual layers (in a direction parallel to the Z direction).

The free magnetic layer 6 is magnetized in a direction parallel to the track width direction (the X direction) under the influence of a bias magnetic field from the hard bias layer 23. On the other hand, each of the first pinned magnetic sublayer 4a and the second pinned magnetic sublayer 4c constituting the pinned magnetic layer 4 is magnetized in a direction parallel to the height direction (the Y direction). Since the pinned magnetic layer 4 has the laminated ferrimagnetic structure, the first pinned magnetic sublayer 4a and the second pinned magnetic sublayer 4c are magnetized antiparallel to each other. While the magnetization of the pinned magnetic layer 4 is pinned (does not vary in response to an external magnetic field), the magnetization of the free magnetic layer 6 varies in response to an external magnetic field.

When the magnetization of the free magnetic layer 6 varies in response to an external magnetic field and when the magnetization directions of the second pinned magnetic sublayer 4c and the free magnetic layer 6 are antiparallel to each other, a tunnel current does not easily flow through the insulating barrier layer 5 provided between the second pinned magnetic sublayer 4c and the free magnetic layer 6, and the resistance is a maximum. On the other hand, when the magnetization directions of the second pinned magnetic sublayer 4c and the free magnetic layer 6 are parallel to each other, the tunnel current flows most easily, and the resistance is a minimum.

By use of the principle described above, a change in electrical resistance caused by a variation in the magnetization of the free magnetic layer 6 under an influence of an external magnetic field is captured as a change in voltage, and thus a leakage magnetic field from a magnetic recording medium is detected.

In the tunneling magnetic sensing element according to this embodiment, a first protective layer 7a composed of iridium-manganese (IrMn) is disposed on the free magnetic layer 6.

Consequently, it is possible to increase the rate of change in resistance ($\Delta R/R$). Moreover, since the composition and thickness of the free magnetic layer 6 are not changed, the magnetostriction X of the free magnetic layer 6 is not greatly increased compared with the known art.

The first protective layer 7a is formed on the free magnetic layer 6, for example, by sputtering IrMn. The thickness of the first protective layer 7a is preferably about 5 to about 200 Å, and more preferably about 10 to about 200 Å.

In IrMn constituting the first protective layer 7a, the Ir content is preferably in a range of about 15 to 30 atomic percent, and more preferably in a range of 15 to about 25 atomic percent.

In this embodiment, even if the first protective layer 7a is formed with a thickness as large as about 200 Å, it is possible to prevent an exchange coupling magnetic field (Hex) from being generated at the interface with the free magnetic layer 6, and it is possible to control so that the magnetization of the free magnetic layer 6 is not pinned.

For example, first, the first protective layer 7a is formed on the free magnetic layer 6 with a thickness (about 5 to 50 Å) at which antiferromagnetism is not exhibited even by annealing treatment in a magnetic field, or an exchange coupling magnetic field is very weak even if antiferromagnetism is exhibited, and the magnetization of the free magnetic layer 6 is not pinned. Then, annealing treatment in a magnetic field is performed. An exchange coupling magnetic field is generated between the first pinned magnetic sublayer 4a and the antiferromagnetic layer 3 by the annealing treatment in the magnetic field, and thereby the magnetization of the first pinned magnetic sublayer 4a is pinned. In this stage, since the thickness of the first protective layer 7a composed of IrMn formed on the free magnetic layer 6 is small, an effective exchange coupling magnetic field is not generated at the interface with the free magnetic layer 6, and the magnetization of the free magnetic layer 6 is not pinned. Then, IrMn is further deposited on the first protective layer 7a with a small thickness to obtain the first protective layer 7a with a predetermined thickness. By using the method described above, even if the first protective layer 7a is formed with a thickness as large as about 200 Å, it is possible to prevent an exchange coupling magnetic field (Hex) from being generated at the interface with the free magnetic layer 6.

If the thickness of the first protective layer 7a is less than about 5 Å, it is not possible to appropriately inhibit the element constituting the second protective layer 7b disposed on the first protective layer 7a from diffusing into the free magnetic layer 6 and the insulating barrier layer 5. This embodiment also includes a structure in which the protective layer 7 is composed of the first protective layer 7a only. In such a case, if the thickness of the first protective layer 7a is less than about 5 Å, the function of preventing oxidation, which is the original function of the protective layer, is degraded, which is undesirable. Therefore, the thickness of the first protective layer 7a is preferably about 5 Å or more.

In this embodiment, the free magnetic layer 6 preferably has a laminated structure including an enhancement layer 6a and a soft magnetic layer 6b. The enhancement layer 6a is composed of a CoFe alloy, has higher spin polarizability than the soft magnetic layer 6b, and is effective in increasing the rate of change in resistance ($\Delta R/R$). In the known art, it is also possible to increase the rate of change in resistance ($\Delta R/R$) by inserting the enhancement layer 6a between the insulating barrier layer 5 and the soft magnetic layer 6b. However, it is necessary to optimize the composition, etc. of the enhancement layer 6a in order to further increase the rate of change in resistance ($\Delta R/R$). In such a case, the magnetostriction $\lambda$ is increased. In contrast, according to this embodiment, by providing the first protective layer 7a composed of IrMn on the free magnetic layer 6, without particularly changing the composition of the enhancement layer 6a or the structure of the remaining portion of the free magnetic layer 6, the rate of change in resistance ($\Delta R/R$) can be more effectively increased while suppressing an increase in the magnetostriction $\lambda$ of the free magnetic layer 6.

Although this embodiment also includes the structure in which the protective layer 7 includes only the first protective layer 7a composed of IrMn, preferably, a second protective layer 7b is disposed on the first protective layer 7a as shown in FIG. 1. Thereby, even if the first protective layer 7a composed of IrMn has a small thickness, by stacking the second protective layer 7b on the first protective layer 7a, the total thickness of the protective layer 7 can be increased, and it is possible to appropriately prevent the laminate under the protective layer 7 from being oxidized. Furthermore, another protective layer may be disposed on the second protective layer 7b.

When the protective layer 7 includes two or more layers, the first protective layer 7a composed of IrMn is disposed on and in contact with the free magnetic layer 6. Consequently, interdiffusion between the free magnetic layer 6 and the second protective layer 7b can be prevented, and the effect of increasing the rate of change in resistance ($\Delta R/R$) is further enhanced.

The second protective layer 7b may be composed of a metal, such as Ta, Ti, Al, Cu, Cr, Fe, Ni, Mn, Co, or V, or an oxide or nitride thereof, which is commonly used as a protective layer.

The second protective layer 7b is preferably composed of, for example, Ta from the standpoint of low electrical resistance and mechanical protection. Ta itself is easily oxidized and thus plays a role in adsorbing oxygen in the laminated structure. Therefore, even if oxygen enters the first protective layer 7a composed of IrMn in the manufacturing process, the second protective layer 7b attracts oxygen and can prevent oxidation from affecting the free magnetic layer 6.

On the other hand, Ta has a property of being easily diffused by heat. In the case where a first protective layer 7a composed of IrMn is not provided and the protective layer 7 has a single-layered structure including the second protective layer 7b composed of Ta as in the known art, Ta of the second protective layer 7b is diffused into the free magnetic layer 6 or further into the insulating barrier layer 5 by heat treatment in the manufacturing process, and the crystallization of the free magnetic layer 6 or the insulating barrier layer 5 is inhibited. In particular, in the tunneling magnetic sensing element in which the insulating barrier layer 5 is composed of magnesium oxide (Mg—O) or a laminate of Mg and Mg—O, it is known that if the free magnetic layer 6, in particular, the enhancement layer 6a in contact with the insulating barrier layer 5, is formed so as to have a body-centered cubic (bcc) crystal structure, a high rate of change in resistance (ΔR/R) can be obtained. However, in the case where the protective layer 7 is composed of Ta only, if Ta is diffused into the free magnetic layer 6 or further into the insulating barrier layer 5 by heat treatment to inhibit crystallization, strain occurs in the body-centered cubic (bcc) structure, and it is not possible to obtain a high rate of change in resistance (ΔR/R).

In the tunneling magnetic sensing element according to this embodiment, since the first protective layer 7a composed of IrMn is inserted between the free magnetic layer 6 and the second protective layer 7b composed of Ta, it is believed that Ta is prevented from diffusing into the free magnetic layer 6 and the insulating barrier layer 5, and that the crystallinity of the free magnetic layer 6 is improved. Therefore, in this embodiment, it is possible to obtain a high rate of change in resistance (ΔR/R) compared with the known art. In particular, in the tunneling magnetic sensing element in which the insulating barrier layer 5 is composed of magnesium oxide (Mg—O) or a laminate of Mg and Mg—O, the crystal structure of each of the free magnetic layer 6 and the insulating barrier layer 5 can be maintained to be a body-centered cubic (bcc) structure satisfactorily, and thus a high rate of change in resistance (ΔR/R) can be obtained.

When the second protective layer 7b is formed, the thickness of the first protective layer 7a can be set in a range of about 5 to about 200 Å and can be set smaller than that when the protective layer 7 is composed of the first protective layer 7a alone. The thickness of the second protective layer 7b may be smaller or larger than the thickness of the first protective layer 7a. The total thickness of the protective layer 7 is about 100 to about 300 Å.

In this embodiment, when the insulating barrier layer 5 is composed of Mg—O or a laminate of Mg and Mg—O, preferably, the second pinned magnetic sublayer 4c is composed of CoFeB and has an amorphous structure. Consequently, the insulating barrier layer 5 can be formed so as to have a body-centered cubic (bcc) structure, and the enhancement layer 6a disposed on the insulating barrier layer 5 can be formed so as to have a body-centered cubic (bcc) structure.

Figure 2:
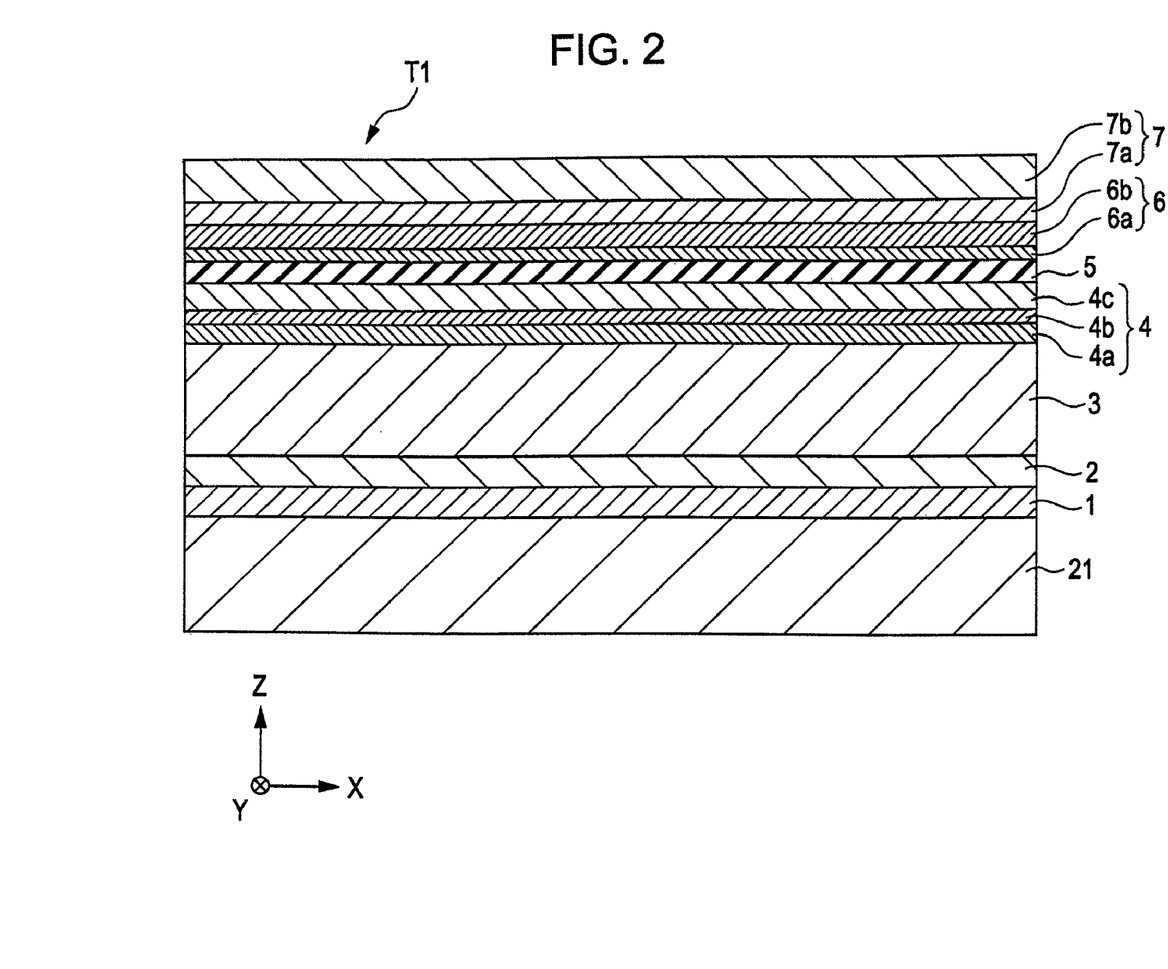
FIG. 2 is a cross-sectional view illustrating a step in a method for manufacturing the tunneling magnetic sensing element according to the embodiment, taken in a direction parallel to a surface facing a recording medium.
Figure 3:
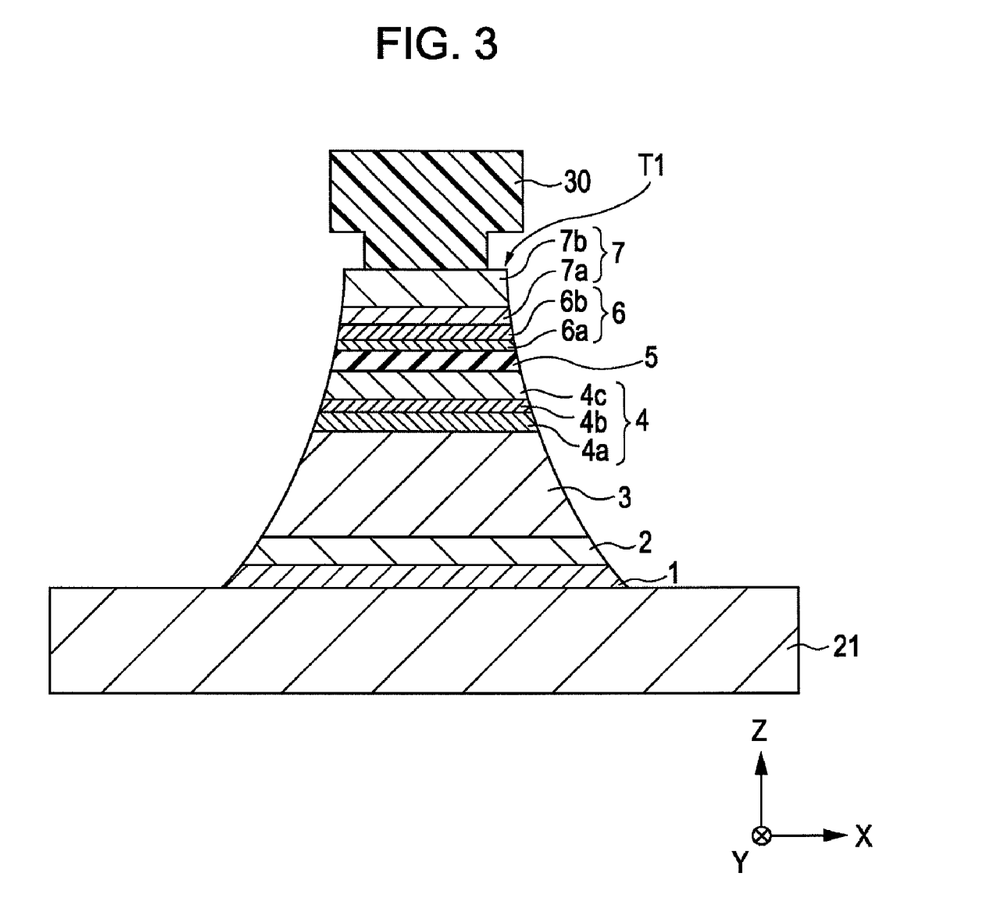
FIG. 3 is a cross-sectional view illustrating a step subsequent to the step shown in FIG. 2 in the method for manufacturing the tunneling magnetic sensing element according to the embodiment, taken in a direction parallel to a surface facing a recording medium.
Figure 4:
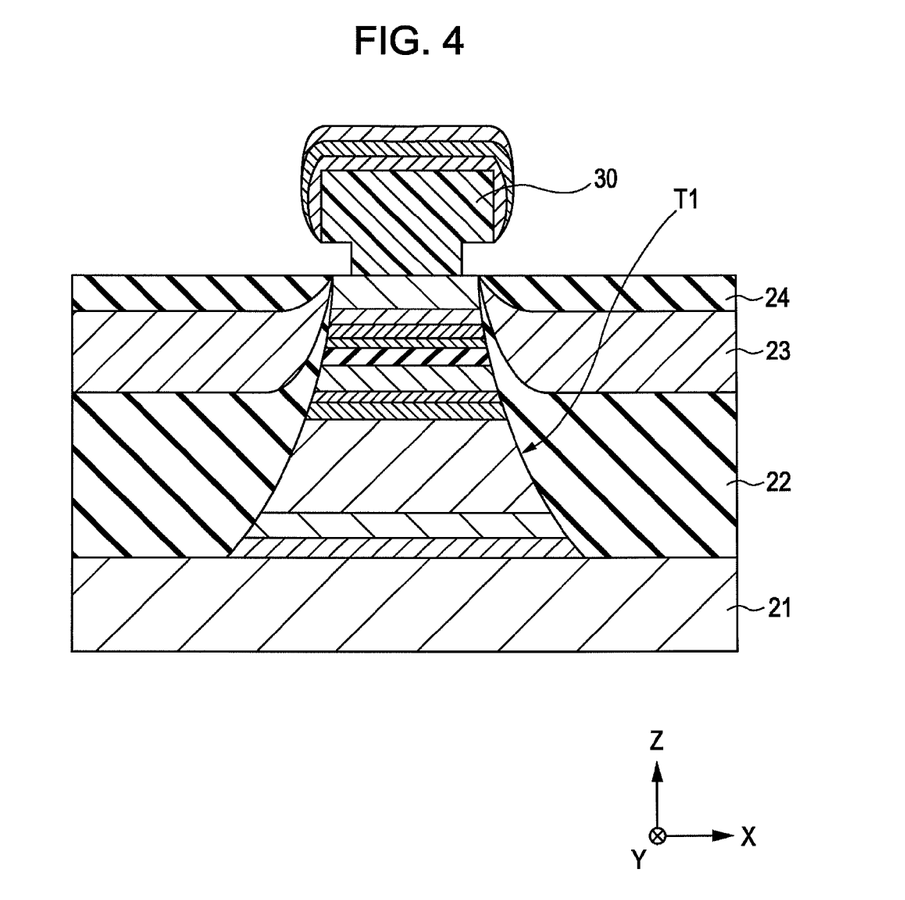
FIG. 4 is a cross-sectional view illustrating a step subsequent to the step shown in FIG. 3 in the method for manufacturing the tunneling magnetic sensing element according to the embodiment, taken in a direction parallel to a surface facing a recording medium.

A method for manufacturing the tunneling magnetic sensing element according to this embodiment will be described below. FIGS. 2 to 4 are each a partial cross-sectional view of the tunneling magnetic sensing element in a manufacturing step, taken in the same direction as that in FIG. 1.

In the step shown in FIG. 2, an underlying layer 1, a seed layer 2, an antiferromagnetic layer 3, a first pinned magnetic sublayer 4a, a nonmagnetic intermediate sublayer 4b, and a second pinned magnetic sublayer 4c are continuously formed on a lower shield layer 21.

Subsequently, an insulating barrier layer 5 is formed by sputtering or the like on the second pinned magnetic sublayer 4c. Alternatively, an insulating barrier layer 5 may be formed by a method in which a metal layer is similarly formed by sputtering or the like, and then oxygen is introduced into the vacuum chamber to oxidize the metal layer. Instead of the metal layer, a semiconductor layer may be formed. Since the thickness of the metal layer or the semiconductor layer is increased by oxidation, the metal layer or the semiconductor layer is formed such that the thickness after oxidation corresponds to the thickness of the insulating barrier layer 5. Examples of the method of oxidation include radical oxidation, ion oxidation, plasma oxidation, and natural oxidation.

In this embodiment, preferably, the insulating barrier layer 5 is formed using magnesium oxide (Mg—O). In such a case, using a target composed of Mg—O having a predetermined compositional ratio, an insulating barrier layer 5 composed of Mg—O is formed by sputtering on the second pinned magnetic sublayer 4c. Alternatively, the insulating barrier layer 5 may be composed of a laminate of Mg and Mg—O formed by sputtering of Mg, followed by oxidation and further sputtering of Mg, or alternately sputtering Mg and Mg—O.

Subsequently, a free magnetic layer 6 including an enhancement layer 6a composed of CoFe and a soft magnetic layer 6b composed of NiFe is formed on the insulating barrier layer 5. Furthermore, a first protective layer 7a is formed using IrMn on the free magnetic layer 6, and a second protective layer 7b is formed thereon using Ta. In such a manner, a laminate T1 in which the layers from the underlying layer 1 to the protective layer 7 are stacked is formed.

Subsequently, a resist layer 30 for lift-off processing is formed on the laminate T1, and then both side regions in the track width direction (in the X direction) of the laminate T1 not covered with the resist layer 30 for lift-off processing are removed by etching or the like (refer to FIG. 3).

Subsequently, a lower insulating layer 22, a hard bias layer 23, and an upper insulating layer 24 are deposited in that order, at each side in the track width direction (in the X direction) of the laminate T1, on the lower shield layer 21 (refer to FIG. 4).

Subsequently, the resist layer 30 for lift-off processing is removed, and an upper shield layer 26 is formed over the laminate T1 and the upper insulating layers 24.

The method for manufacturing the tunneling magnetic sensing element described above includes annealing treatment. Typical examples of annealing treatment include annealing treatment in a magnetic field for producing an exchange coupling magnetic field (Hex) between the antiferromagnetic layer 3 and the first pinned magnetic sublayer 4a. The annealing treatment is carried out at a temperature of 240° C. to 310° C.

In the method for manufacturing the tunneling magnetic sensing element according to this embodiment, in the step shown in FIG. 2, the first protective layer 7a composed of IrMn is formed on the free magnetic layer 6. In this stage, the first protective layer 7a is formed with a thickness at which an exchange coupling magnetic field (Hex) is not generated even by the annealing treatment or even if an exchange coupling magnetic field is generated, its magnitude is not so large as to pin the magnetization of the free magnetic layer 6. Alternatively, at first, the first protective layer 7a is formed with a thickness at which an exchange coupling magnetic field is not generated at the interface with the free magnetic layer 6 even by annealing treatment, and after the annealing treatment, the thickness of the first protective layer 7a may be increased to the predetermined thickness.

In this embodiment, since the first protective layer 7a composed of IrMn is formed directly on the free magnetic layer 6, even when the annealing treatment in the magnetic field or another annealing treatment is carried out, it is believed that it is possible to inhibit the constituent element, such as Ta, of the second protective layer 7b from diffusing into the free magnetic layer 6 and the insulating barrier layer 5 and that the crystallinity of the free magnetic layer 6 can be improved.

By the method described above, it is possible to appropriately and easily manufacture a tunneling magnetoresistance element in which the rate of change in resistance (ΔR/R) can be effectively increased without changing the composition or thickness of the free magnetic layer 6 and without increasing the magnetostriction λ of the free magnetic layer 6.

The tunneling magnetic sensing elements according to this embodiment can also be used as magnetoresistive random access memory (MRAM) and magnetic sensors, in addition to for use in hard disk drives.

EXAMPLE 1

A tunneling magnetic sensing element shown in FIG. 1 was fabricated. A laminate T1 was formed by depositing, from the bottom, underlying layer 1;Ta(80)/seed layer 2;$Ni_{49\ at\ \%}Fe_{12\ at\ \%}Cr_{39\ at\ \%}$(50)/antiferromagnetic layer 3;$Ir_{26\ at\ \%}Mn_{74\ at\ \%}$(70)/pinned magnetic layer 4 [first pinned magnetic sublayer 4a;$Co_{70\ at\ \%}Fe_{30\ at\ \%}$(14)/nonmagnetic intermediate sublayer 4b;Ru(91)/second pinned magnetic sublayer 4c;$Co_{40\ at\ \%}Fe_{40\ at\ \%}B_{20\ at\ \%}$(18)]/insulating barrier layer 5;MgO(12)/free magnetic layer 6 [enhancement layer 6a;$Co_{50\ at\ \%}Fe_{50\ at\ \%}$(10)/soft magnetic layer 6b;$Ni_{87\ at\ \%}Fe_{13\ at\ \%}$(50)]/protective layer 7 [first protective layer; $Ir_{23\ at\ \%}Mn_{77\ at\ \%}$(20)/second protective layer;Ta(180)]. A numerical value in parentheses indicates the average thickness of each layer in unit of angstrom (A). After the laminate T1 was formed, annealing treatment was carried out at 270° C. for 3 hours 30 minutes.

A tunneling magnetic sensing element was fabricated as in Example 1 except that, without forming a first protective layer 7a, the protective layer 7 was formed so as to include one layer of Ta (200 Å) (Comparative Example 1).

With respect to the tunneling magnetic sensing element in each of Example 1 and Comparative Example 1, the rate of change in resistance (ΔR/R), element resistance R×element area A (RA), the magnetostriction (λ) of the free magnetic layer 6, and the magnetic moment per unit area (Ms·t) were measured. The results thereof are shown in Table 1 below.

sensing element of Comparative Example 1 in which the protective layer 7 is composed of Ta only.

Figure 5:
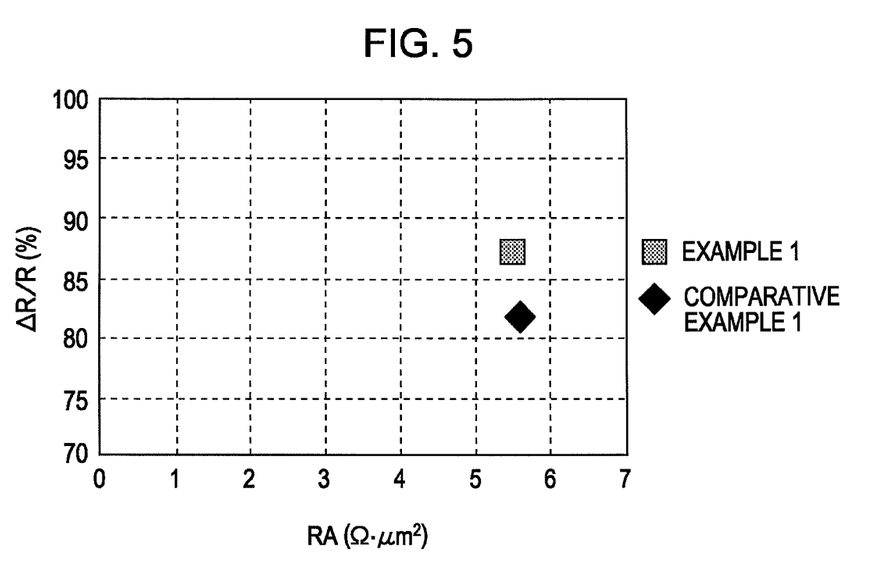
FIG. 5 is a graph showing the relationship between RA (element resistance R×element area A) and $\Delta R/R$ (rate of change in resistance) in each of a case where a first protective layer is formed (Example 1) and a case where a first protective layer is not formed (Comparative Example 1)

In the tunneling magnetic sensing element, when the RA (element resistance R×element area A) increases, it is not possible to achieve a higher recording density. Consequently, preferably, a high rate of change in resistance (ΔR/R) is obtained at a low range of RA (element resistance R×element area A). As shown in FIG. 5, the RA is substantially the same in Example 1 and Comparative Example 1.

Figure 6:
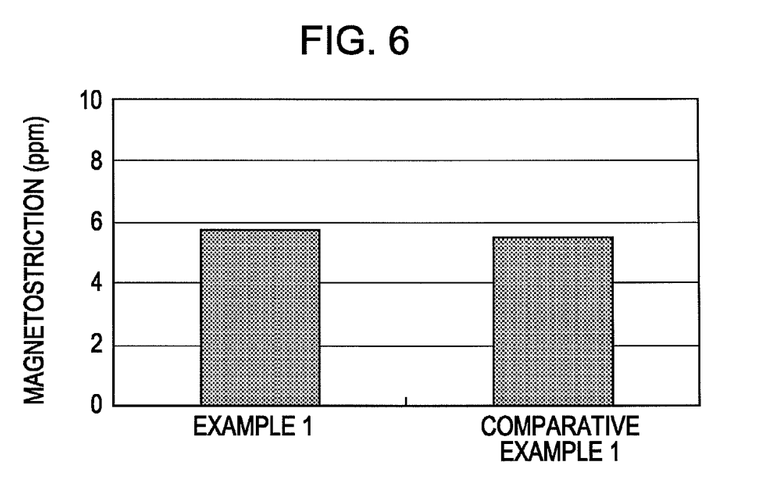
FIG. 6 is a graph showing the magnetostriction ($\lambda$) of a free magnetic layer of a tunneling magnetic sensing element in each of a case where a first protective layer is formed (Example 1) and a case where a first protective layer is not formed (Comparative Example 1).

As is evident from Table 1 and FIG. 6, in Example 1 and in Comparative Example 1, each of the magnetostriction (λ) and the magnetic moment per unit area (Ms·t) is substantially the same. In particular, in Example 1, the magnetic moment per unit area is slightly larger than that in Comparative Example 1, and therefore, it is believed that by inserting the first protective layer composed of IrMn between the first protective layer and the second protective layer composed of Ta, Ta is inhibited from diffusing into the free magnetic layer and the crystallinity of the free magnetic layer is improved. As a result, as shown in Table 1 and FIG. 5, it is believed that in Example 1, a higher rate of change in resistance (ΔR/R) is obtained than that in Comparative Example 1.

What is claimed is:

1. A tunneling magnetic sensing element comprising:
    a pinned magnetic layer whose magnetization direction is pinned in one direction;
    an insulating barrier layer disposed on the pinned magnetic layer;
    a free magnetic layer whose magnetization direction varies in response to an external magnetic field disposed on the insulating barrier layer; and
    a first protective layer composed of iridium-manganese (IrMn) disposed on the free magnetic layer,
    wherein the free magnetic layer includes an enhancement layer composed of a CoFe alloy and a soft magnetic layer composed of a NiFe alloy disposed in that order from the bottom, the enhancement layer is in contact with the insulating barrier layer, and the soft magnetic layer is in contact with the first protective layer.

2. The tunneling magnetic sensing element according to claim 1, further comprising a second protective layer composed of tantalum (Ta) disposed on the first protective layer.

TABLE 1

|  | First protective layer (thickness) | Second protective layer (thickness) | RA ($\Omega \cdot \mu m^2$) | ΔR/R (%) | Magnetostriction (ppm) | Ms · t (memu/cm$^2$) |
|---|---|---|---|---|---|---|
| Example 1 | IrMn (20 Å) | Ta (180 Å) | 5.5 | 87.3 | 5.7 | 0.55 |
| Comparative Example 1 | — | Ta (200 Å) | 5.6 | 81.9 | 5.5 | 0.48 |

On the basis of the results shown in Table 1, the relationship between RA (element resistance R×element area A) and ΔR/R (rate of change in resistance) is shown in a graph of FIG. 5, and the magnetostriction (λ) in each of Example 1 and Comparative Example 1 is shown in a graph of FIG. 6.

As is evident from Table 1 and FIG. 5, in the tunneling magnetic sensing element of Example 1 in which the protective layer 7 has a laminated structure including the first protective layer 7a composed of IrMn and the second protective layer 7b composed of Ta, the rate of change in resistance (ΔR/R) is increased compared with the tunneling magnetic 3. The tunneling magnetic sensing element according to claim 1, wherein the insulating barrier layer is composed of magnesium oxide (Mg—O) or a laminate of Mg and Mg—O, and the enhancement layer has a body-centered cubic structure.

4. A method for manufacturing a tunneling magnetic sensing element comprising the steps of:
    (a) forming a pinned magnetic layer and forming an insulating barrier layer on the pinned magnetic layer;
    (b) forming a free magnetic layer on the insulating barrier layer; and (c) forming a first protective layer composed of iridium-manganese (IrMn) on the free magnetic layer, wherein in the step (a), the insulating barrier layer is formed using magnesium oxide (Mg—O) or a laminate of Mg and Mg—O, and in the step (b), the free magnetic layer is formed so as to include an enhancement layer composed of a CoFe alloy and a soft magnetic layer composed of a NiFe alloy deposited in that order from the bottom.

5. The method for manufacturing the tunneling magnetic sensing element according to claim 4, wherein in the step (c), after the first protective layer is formed, a second protective layer composed of tantalum (Ta) is formed on the first protective layer.

6. The method for manufacturing the tunneling magnetic sensing element according to claim 4, wherein after the step (c), annealing treatment is performed.

* * * * *